(12) United States Patent
Choi et al.

(10) Patent No.: US 9,281,361 B2
(45) Date of Patent: Mar. 8, 2016

(54) SEMICONDUCTOR DEVICES AND METHODS OF FABRICATING THE SAME

(71) Applicant: Samsung Electronics Co., Ltd., Suwon-Si, Gyeonggi-Do (KR)

(72) Inventors: Jongwan Choi, Suwon-si (KR); Bo-Young Lee, Hwaseong-si (KR); Myoungbum Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 47 days.

(21) Appl. No.: 14/028,912

(22) Filed: Sep. 17, 2013

(65) Prior Publication Data

US 2014/0084384 A1 Mar. 27, 2014

(30) Foreign Application Priority Data

Sep. 21, 2012 (KR) .......................... 10-2012-0105403

(51) Int. Cl.
*H01L 29/06* (2006.01)
*H01L 21/764* (2006.01)
*H01L 27/115* (2006.01)

(52) U.S. Cl.
CPC .......... *H01L 29/0649* (2013.01); *H01L 21/764* (2013.01); *H01L 27/11529* (2013.01)

(58) Field of Classification Search
CPC ............ H01L 21/764; H01L 29/66825; H01L 29/66833; H01L 27/11529
See application file for complete search history.

(56) References Cited

U.S. PATENT DOCUMENTS

| | | | | |
|---|---|---|---|---|
| 5,461,003 | A | * 10/1995 | Havemann et al. | 438/666 |
| 7,078,352 | B2 | * 7/2006 | Beyer et al. | 438/739 |
| 7,868,376 | B2 | * 1/2011 | Aoyama et al. | 257/324 |
| 2001/0023123 | A1 | 9/2001 | Kim | |
| 2004/0137728 | A1 | 7/2004 | Gallagher et al. | |
| 2006/0231884 | A1 | * 10/2006 | Yonemochi et al. | 257/314 |
| 2007/0120263 | A1 | 5/2007 | Gabric et al. | |
| 2008/0182403 | A1 | 7/2008 | Noori et al. | |
| 2008/0217294 | A1 | * 9/2008 | Ko et al. | 216/57 |
| 2009/0023279 | A1 | 1/2009 | Kim et al. | |
| 2010/0237398 | A1 | * 9/2010 | Kamigaichi et al. | 257/316 |
| 2010/0248471 | A1 | 9/2010 | Nam et al. | |
| 2012/0001264 | A1 | 1/2012 | Kim et al. | |
| 2012/0156855 | A1 | * 6/2012 | Sim | 438/421 |
| 2013/0049098 | A1 | * 2/2013 | Izumi et al. | 257/324 |

FOREIGN PATENT DOCUMENTS

| | | |
|---|---|---|
| KR | 20010004241 A | 1/2001 |
| KR | 20040002234 A | 1/2004 |
| KR | 100672823 B1 | 1/2007 |
| KR | 20090036879 A | 4/2009 |

* cited by examiner

*Primary Examiner* — Cheung Lee
*Assistant Examiner* — Stephen Bradley
(74) *Attorney, Agent, or Firm* — Harness, Dickey, & Pierce, P.L.C.

(57) ABSTRACT

A semiconductor device includes a plurality of gate structures on a substrate, the plurality of gate structures including a gate metal pattern and delimiting air gaps formed therebetween, an insulating layer on the plurality of gate structures, and a porous insulating layer between the plurality of gate structures and the insulating layer, the porous insulating layer configured to cross the plurality of gate structures to delimit the air gaps.

7 Claims, 16 Drawing Sheets

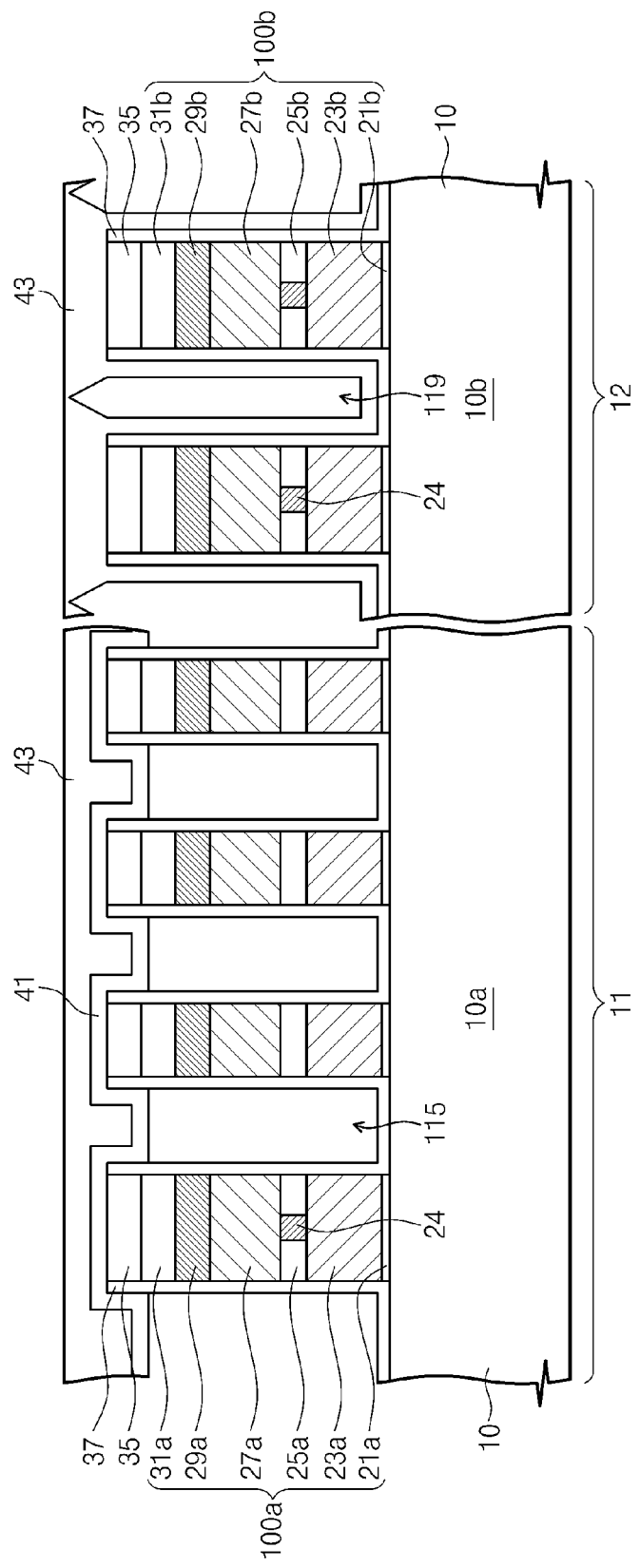

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0105403, filed on Sep. 21, 2012, in the Korean Intellectual Property Office, the entire contents of which are hereby incorporated by reference.

BACKGROUND

1. Field

Some example embodiments relate to a semiconductor device and a method of fabricating the same, and in particular, to a nonvolatile memory device and a method of fabricating the same.

2. Description of the Related Art

Generally, semiconductor memory devices may be classified into volatile memory devices and non-volatile memory devices. The non-volatile memory device includes non-volatile memory cells capable of preserving stored data without a power supply.

A nonvolatile memory device retains stored data even when power supply is cut off and includes a Programmable ROM (PROM), an Erasable PROM (EPROM), an Electrically EPROM (EEPROM), and a Flash Memory Device, among others. Among them, the flash memory device electrically programs and erases data using Fowler-Nordheim tunneling or channel hot electron injection. A flash memory device may have memory cells of various types and may be classified into a NAND type and a NOR type based on a cell array structure. In addition, the flash memory device may be classified into floating-gate-type flash memory devices and charge-trap-type flash memory devices according to the type of a memory storage layer constituting a unit cell.

SUMMARY

Some example embodiments provide a semiconductor device with improved reliability.

According to an example embodiment, a semiconductor device includes a plurality of gate structures on a substrate, the plurality of gate structures including a gate metal pattern and delimiting air gaps formed therebetween, an insulating layer on the plurality of gate structures, and a porous insulating layer between the plurality of gate structures and the insulating layer. The porous insulating layer is configured to cross the plurality of gate structures to delimit the air gaps.

In an example embodiment, the device may further include a metal protection layer on the insulating layer.

In an example embodiment, the device may further include a metal protection layer between the insulating layer and the porous insulating layer.

In an example embodiment, the metal protection layer may include one of silicon (Si), oxygen (O), nitrogen (N), hydrogen (H), and a combination thereof.

In an example embodiment, the plurality of gate structures may include a tunnel insulating pattern, a floating gate pattern, an inter-gate insulating pattern, a control gate pattern, the gate metal pattern, and a capping pattern sequentially stacked on the substrate.

In an example embodiment, the plurality of gate structures may include a tunnel insulating pattern, a charge storing pattern, a blocking insulating pattern, a control gate pattern, the gate metal pattern, and a capping pattern sequentially stacked on the substrate.

In an example embodiment, the porous insulating layer may cover a top surface of the plurality of gate structures, and a bottom surface of a portion of the porous insulating layer between the plurality of gate structures may be located above a top surface of the gate metal pattern.

In an example embodiment, the porous insulating layer may include an insulating material having an etch rate of about 100-200 Å/min while being etched by a wet etching process using 200:1 HF etching solution.

According to another example embodiment, a semiconductor device includes cell gate structures on a substrate, the cell gate structures having first air gaps therebetween, peripheral gate structures on the substrate, the peripheral structures having second air gaps therebetween, an insulating layer on the cell gate structures and the peripheral gate structures, the insulating layer configured to cover sidewalls of the peripheral gate structures and the second air gaps, and a porous insulating layer between the cell gate structures and the insulating layer. The porous insulating layer may be configured to cross the cell gate structures to delimit the first air gaps, and a bottom surface of a portion of the porous insulating layer delimiting the first air gaps is located below a portion of the insulating layer covering an upper portion of the second air gaps.

In another example embodiment, the device may further include a metal protection layer on the insulating layer.

In another example embodiment, the device may further include a metal protection layer between the insulating layer and the porous insulating layer. The metal protection layer may extend between the peripheral gate structures and the insulating layer.

In another example embodiment, the metal protection layer may include one of silicon (Si), oxygen (O), nitrogen (N), hydrogen (H), and a combination thereof.

In another example embodiment, each of the cell gate structures may include a gate metal pattern, the porous insulating layer may cover a top surface of the cell gate structures and a portion of the porous insulating layer between the cell gate structures may have a bottom surface located above a top surface of the gate metal pattern.

In another example embodiment, the bottom surface of the portion of the porous insulating layer delimiting the first air gaps is flat, and the portion of the insulating layer covering the second air gaps may be V-shaped.

In another example embodiment, each of the first air gaps may be delimited by the cell gate structures and the porous insulating layer, and the second air gaps may be delimited by the insulating layer.

According to still another example embodiment, a semiconductor device includes a porous insulating layer over a plurality of stacked structures to define air gaps between the plurality of stacked structures and a substrate on which the stacked structures are disposed, the plurality of stacked structures including a gate metal pattern having a top surface located below a bottom surface of a portion of the porous insulating layer over the air gaps.

In still another example embodiment, the device may further include a metal protection layer on the plurality of stacked structures and the air gaps.

In still another example embodiment, the device may further include an insulating layer between the porous insulating layer and the metal protection layer.

In still another example embodiment, the metal protection layer may include one of silicon (Si), oxygen (O), nitrogen (N), hydrogen (H) and a combination thereof.

In still another example embodiment, each of the air gaps may have at least one of a uniform size, shape and volume.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A through 6H are sectional views illustrating a method of fabricating a semiconductor device, according to an example embodiment.

Figure 1:
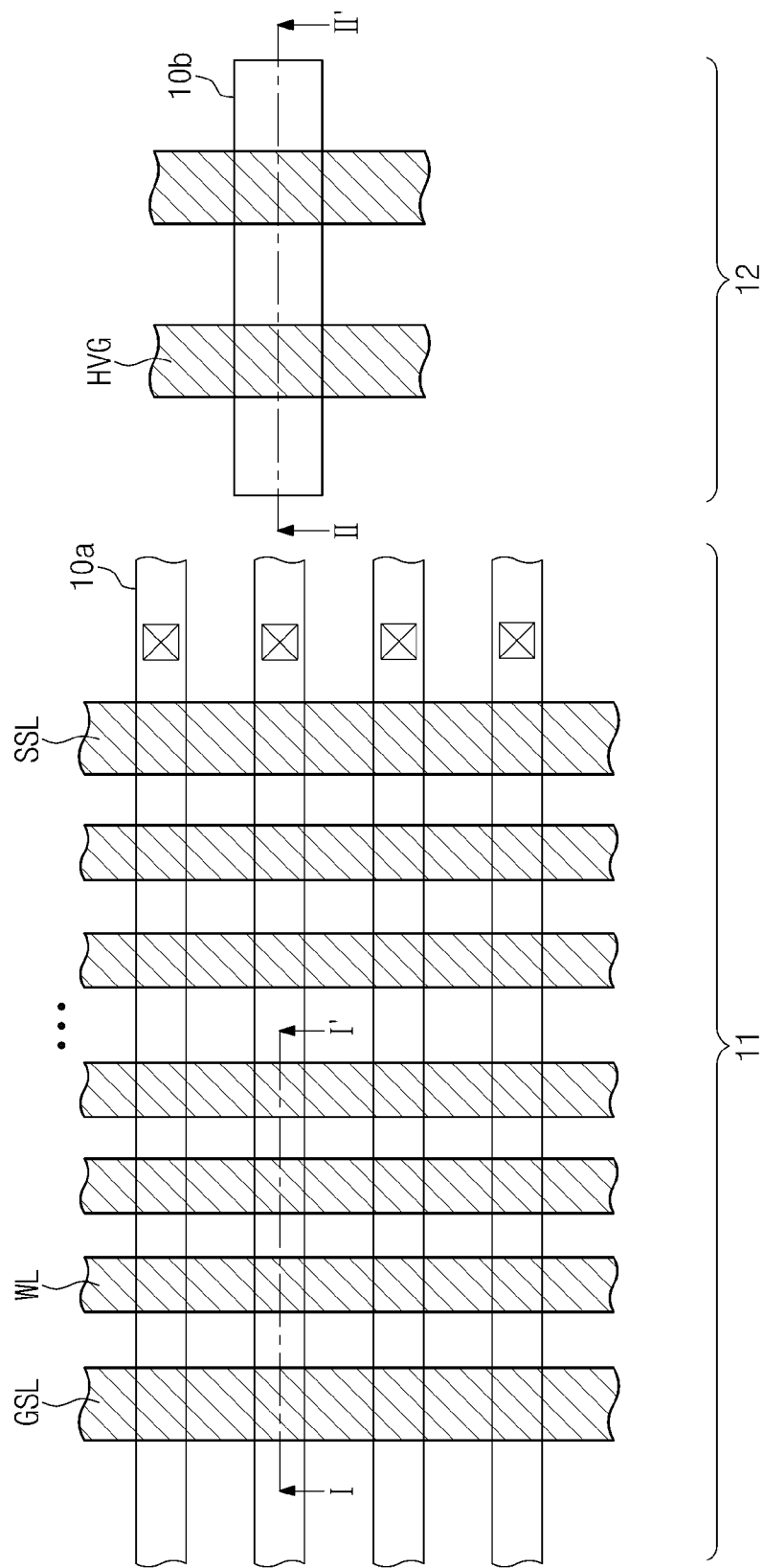
FIG. 1 is a plan view of a semiconductor device according to an example embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
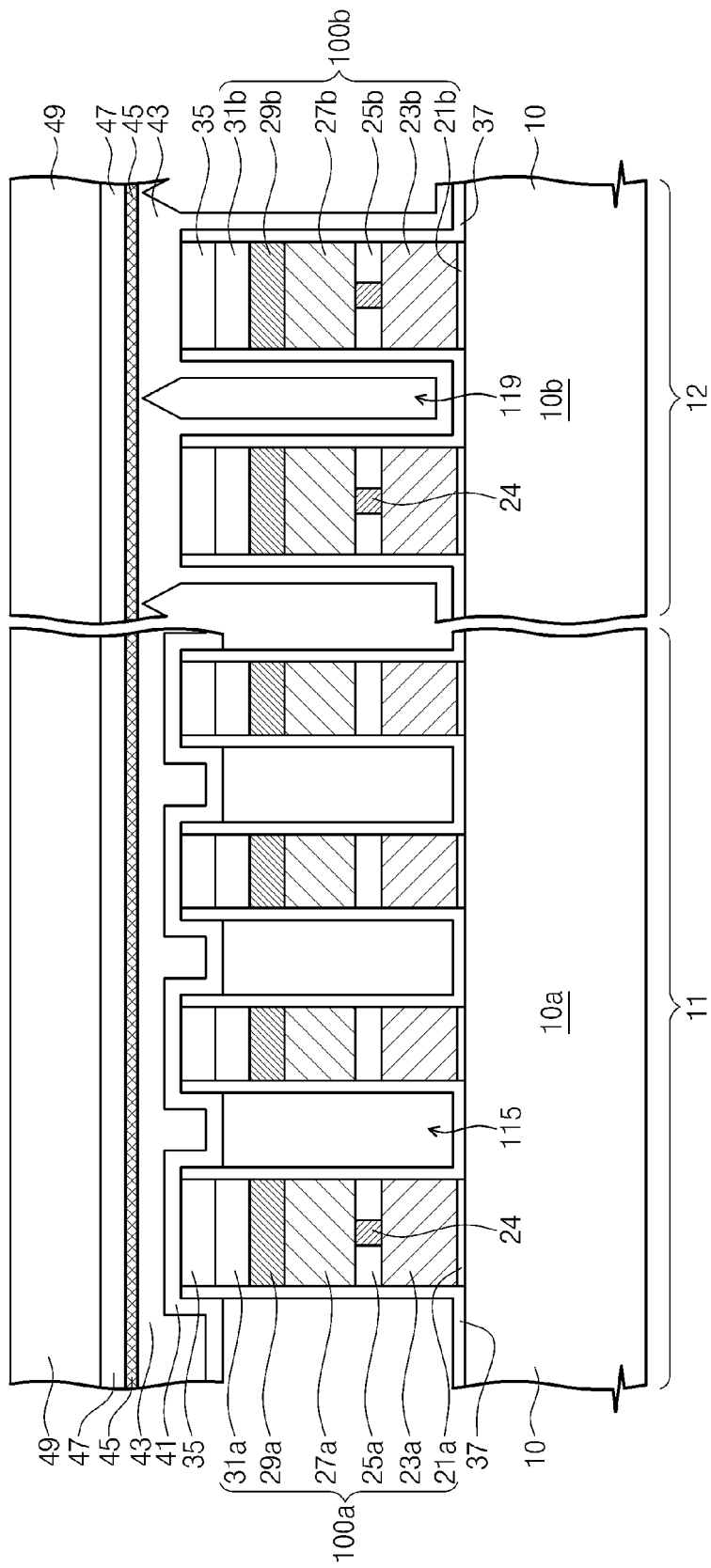
FIG. 2 is a sectional view of a semiconductor device according to an example embodiment, taken along lines I-I' and II-II' of FIG. 1.

FIG. 1 is a plan view of a semiconductor device according to an example embodiment, and FIG. 2 is a sectional view of a semiconductor device according to an example embodiment, taken along lines I-I' and II-II' of FIG. 1.

Referring to FIGS. 1 and 2, a substrate 10 may include a cell region 11 and a peripheral circuit region 12. The substrate 10 may be a silicon wafer. In example embodiments, NAND FLASH memory cells may be formed on the cell region 11. For example, cell gate electrodes WL, a ground selection gate electrode GSL and a string selection gate electrode SSL may be provided on the cell region 11. Peripheral transistors may be provided on the peripheral circuit region 12.

The cell region 11 may include first active regions 10a. The peripheral circuit region 12 may include a second active region 10b. The first active regions 10a and the second active region 10b may be formed to have plan shapes different from each other. The first active regions 10a and the second active regions 10b may be portions of the substrate 10 delimited or surrounded by a device isolation layer (not shown).

In the cell region 11, the cell gate electrodes WL, the ground selection gate electrode GSL and the string selection gate electrode SSL may be provided to cross the first active regions 10a. In the peripheral circuit region 12, low-voltage gate electrodes (not shown) or high-voltage gate electrodes HVG may be provided to cross the second active region 10b.

A plurality of cell gate structures 100a may be arranged parallel to each other, with a substantially equal interval, on the cell region 11, and a plurality of peripheral gate structures 100b may be provided on the peripheral circuit region 12. In example embodiments, the ground selection gate electrode GSL, the cell gate electrodes WL, and the string selection gate electrode SSL may be provided in the form of the cell gate structure 100a, while the high-voltage gate electrodes HVG may be provided in the form of the gate structures 100b.

Each of the cell gate structures 100a may include a tunnel insulating pattern 21a, a floating gate pattern 23a, an inter-gate insulating pattern 25a, a control gate pattern 27a, a gate metal pattern 29a, and a capping pattern 31a sequentially stacked on the cell region 11 of the substrate 10. Each of the peripheral gate structures 100b may include a peripheral insulating pattern 21b, a lower gate pattern 23b, an intermediate insulating pattern 25b, an upper gate pattern 27b, a metal pattern 29b, and a protection pattern 31b sequentially stacked on the peripheral circuit region 12 of the substrate 10. A hard mask pattern 35 may be additionally provided on the capping pattern 31a and the protection pattern 31b.

In addition, each of the ground selection gate electrode GSL and the high-voltage gate electrodes HVG may further include a contact electrode 24 connecting the floating gate pattern 23a to the control gate pattern 27a or connecting the lower gate pattern 23b to the upper gate pattern 27b.

The tunnel insulating pattern 21a and the peripheral insulating pattern 21b may include a silicon oxide layer. For example, the peripheral insulating pattern 21b may be formed of a silicon oxidation layer formed by a thermal oxidation process. The tunnel insulating pattern 21a may have a thickness that is substantially equivalent to or smaller than that of the peripheral insulating pattern 21b. The tunnel insulating pattern 21a may be configured in such a way that electric charges can be injected from the semiconductor substrate 10 into the floating gate pattern 23a through an FN tunneling, during a program operation.

The floating gate pattern 23a and the lower gate pattern 23b may be formed of a p- or n-type polysilicon layer. In the p-type case, the floating gate pattern 23a and the lower gate pattern 23b may be doped with impurities, such as, boron, aluminum, and gallium. In the n-type case, the floating gate pattern 23a and the lower gate pattern 23b may be doped with impurities, such as, phosphorus, arsenic, bismuth, or antimony. The floating gate pattern 23a may be electrically isolated from other conductive patterns, and thus, electric charges stored therein can be preserved even in the case that no power is supplied to the device.

Each of the inter-gate insulating pattern 25a and the intermediate insulating pattern 25b may include at least one of an oxide layer having a thickness greater than that of the tunnel insulating pattern 21a, a layer stack including a lower oxide layer, a nitride layer, and an upper oxide layer, or high-k dielectric layers. In example embodiments, the inter-gate insulating pattern 25a and the intermediate insulating pattern 25b may be formed of a high-k dielectric layer.

The contact electrode 24 may be formed of a doped silicon layer or a metal layer, similar to the floating gate pattern 23a and the lower gate pattern 23b.

The control gate pattern 27a and the upper gate pattern 27b may be formed of substantially the same material as the floating gate pattern 23a and the lower gate pattern 23b and be doped with substantially the same impurities. The control gate pattern 27a and the upper gate pattern 27b may be formed to have a smaller thickness than the floating gate pattern 23a and the lower gate pattern 23b, respectively.

The gate metal pattern 29a and the metal pattern 29b may be formed to have a single-layered or multi-layered structure including at least one of tungsten (W), molybdenum (Mo), tungsten nitride (WN), molybdenum nitride (MoN), titanium nitride (TiN), or tantalum nitride (TaN). In example embodiments, the control gate pattern 27a and the gate metal pattern 29a may serve as a control gate electrode, while the upper gate pattern 27b and the metal pattern 29b may serve as an upper gate electrode.

The capping pattern 31a and the protection pattern 31b may be formed of an insulating material (for example, of a silicon nitride (SiN) layer). The hard mask patterns 35 may be formed of a silicon oxide ($SiO_2$) layer.

An etch stop layer 37 may be formed to cover sidewalls of the gate structures 100a and 100b. In example embodiments, the etch stop layer 37 may extend to cover portions of the substrate 10 between the gate structures 100a and 100b. In example embodiments, however, the etch stop layer 37 may not be formed on top surfaces of the gate structures 100a and 100b, such that the hard mask patterns 35 may be exposed by the etch stop layer 37. The etch stop layer 37 may include a silicon nitride layer or a silicon oxynitride layer.

A porous insulating layer 41 may be provided on the cell gate structures 100a. For example, the porous insulating layer 41 may extend laterally from the top surfaces of the cell gate structures 100a but be formed spaced apart from a bottom surface of the etch stop layer 37 between the cell gate structures 100a. In example embodiments, between the cell structures 100a, the bottom surface of the porous insulating layer 41 may be located at a level higher than a top surface of the gate metal pattern 29a. The porous insulating layer 41 may be formed to a conformal thickness. Accordingly, the porous insulating layer 41 may have a flat bottom surface. The porous insulating layer 41 may be an insulating layer, in which pores are provided to have a volumetric percentage of about 5-50%. In a wet etching process using HF solution, the porous insulating layer 41 may be formed of a material having an etch rate higher than those of the inter-gate insulating pattern 25a and the intermediate insulating pattern 25b. For example, the first porous insulating layer 41 may have an etch rate of about 100-200 Å/min, when etched using 200:1 HF etching solution.

First air gaps 115 may be formed between the cell gate structures 100a. Each of the first air gaps 115 may be delimited by the etch stop layer 37 and the porous insulating layer 41. For example, each of the first air gaps 115 may be surrounded by the etch stop layer 37 and the porous insulating layer 41. Further, a bottom surface of a portion of the porous insulating layer 41 delimiting each of the first air gaps 115 may be flat and may be located at a level higher than that of the gate metal pattern 29a as defined by the porous insulating layer 41. The first air gaps 115 may be formed to have a uniform size, shape, and/or volume, which enables improvement to the interference characteristics of the cell gate structures 110a.

An insulating layer 43 may be formed on the substrate 10 provided with the first air gap 115. On the cell region 11, the insulating layer 43 may cover a top surface of the porous insulating layer 41.

On the peripheral circuit region 12, the insulating layer 43 may be formed on the peripheral gate structures 100b and extend between the peripheral gate structures 100b to cover sidewalls of the etch stop layer 37.

In example embodiments, the insulating layer 43 may be formed to fill incompletely a gap between the peripheral gate structures 100b, thereby forming second air gaps 119. For example, the second air gap 119 may be an empty space delimited by the insulating layer 43. The second air gap 119 may extend upward in the insulating layer 43 such that a surface of the insulating layer 43 delimiting the second air gap 119 may be higher than an upper surface of the hard mask patterns 35 and may be V-shaped. As a result, the second air gap 119 may have a thickness or vertical length that is greater than that of the first air gap 115.

A metal protection layer 45 may be formed on the insulating layer 43. The metal protection layer 45 may include a layer made of at least two elements selected from the group consisting of silicon (Si), oxygen (O), nitrogen (N), and hydrogen (H). For example, the metal protection layer 45 may be a silicon nitride layer or a silicon oxynitride layer. The metal protection layer 45 may be formed to have a thickness ranging from about 10 Å to 100 Å.

In the absence of the metal protection layer 45, the gate metal pattern 29a may be eroded during a subsequent thermal oxidation step, in which may be performed using $N_2$ or $O_2$ gas at a temperature of about 750° C. or more. According to example embodiments, however, this erosion of the gate metal pattern 29a can be prevented or reduced by the metal protection layer 45.

A lower interlayered insulating layer 47 and an upper interlayered insulating layer 49 may be sequentially provided on the metal protection layer 45. The lower interlayered insulating layer 47 may be formed to have a thickness smaller than that of the upper interlayered insulating layer 49. In example embodiments, the lower and upper interlayered insulating layers 47 and 49 may be formed of silicon oxide ($SiO_2$).

A common source line (not shown) may be provided on the cell region 11 to penetrate the lower interlayered insulating layer 47. The common source line may be disposed spaced apart from the cell gate structure 100a. The common source line may be formed to be in direct contact with the first active region 10a.

Figure 3:
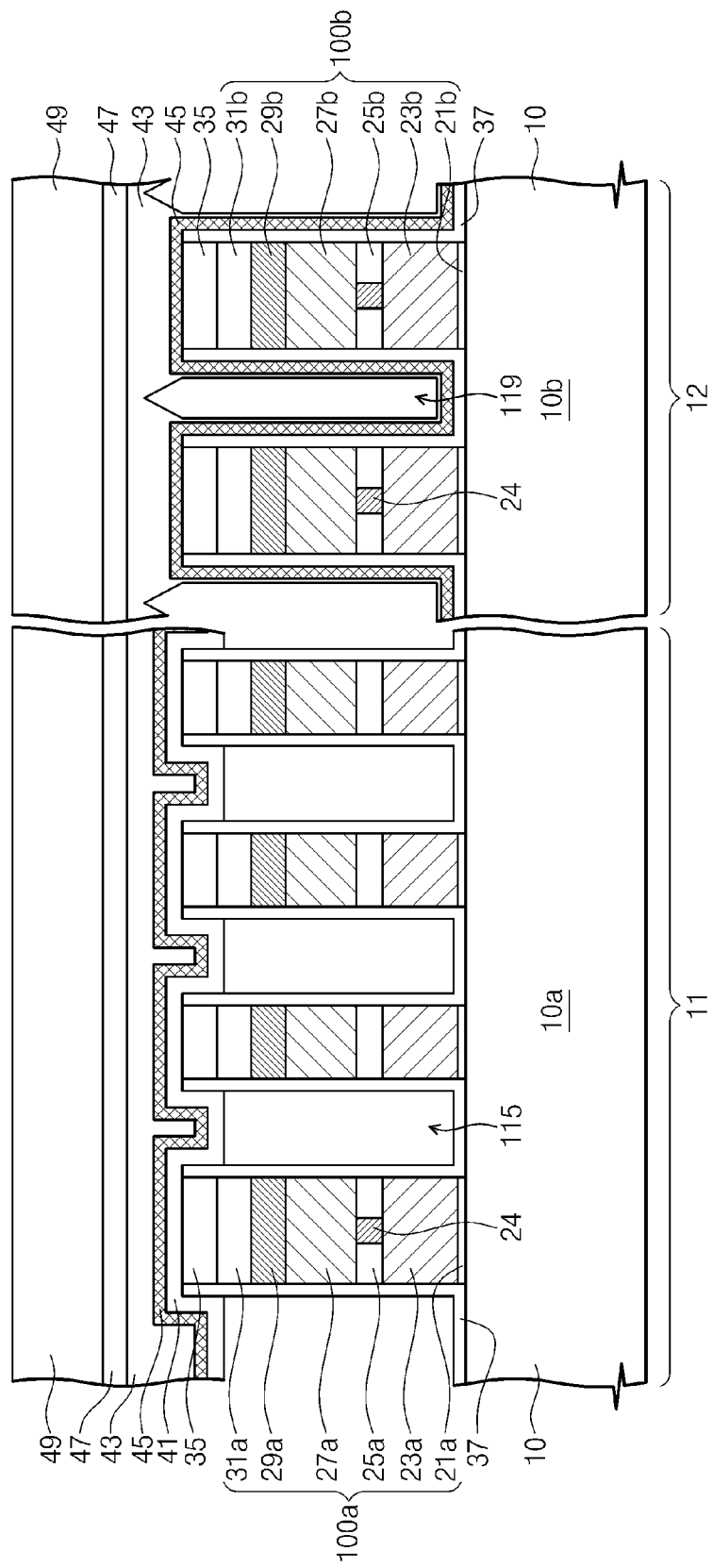
FIG. 3 is a sectional view of a semiconductor device according to another example embodiment, taken along lines I-I' and II-II' of FIG. 1.

FIG. 3 is a sectional view of a semiconductor device according to another example embodiment, taken along lines I-I' and II-II' of FIG. 1.

For concise description, in a description of the semiconductor device of FIG. 3, a previously described element may be identified by a similar or identical reference number without repeating an overlapping description thereof.

Referring to FIG. 3, the metal protection layer 45 may be formed on the gate structures 100a and 100b, before the formation of the insulating layer 43. For example, on the cell region 11, the metal protection layer 45 may be provided between the porous insulating layer 41 and the insulating layer 43 to have substantially the same profile as that of the porous insulating layer 41. On the peripheral circuit region 12, the metal protection layer 45 may be formed to cover conformally the peripheral gate structures 100b provided with the etch stop layer 37. In addition, the metal protection layer 45 may extend to cover the etch stop layer 37 between the peripheral gate structures 100b.

Figure 4:
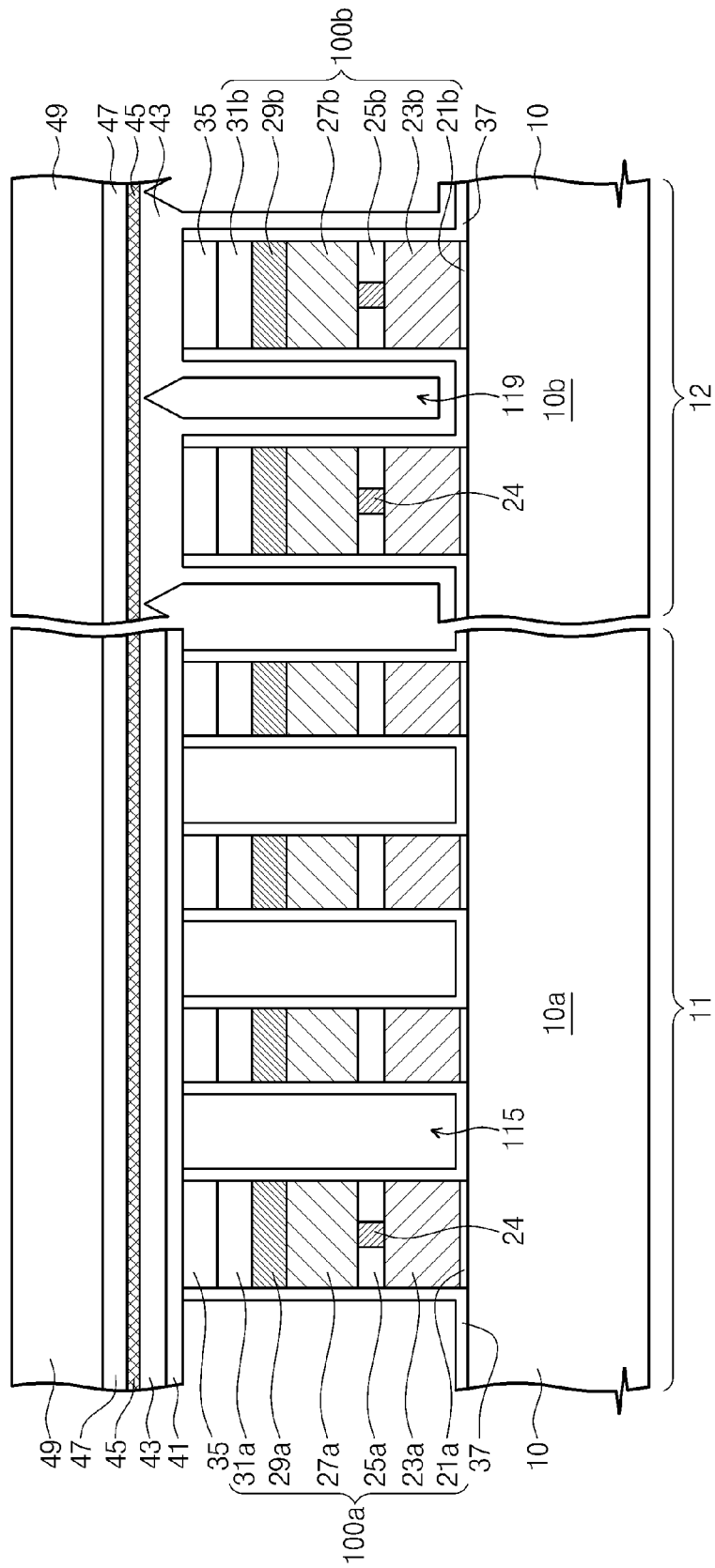
FIG. 4 is a sectional view of a semiconductor device according to still another example embodiment, taken along lines I-I' and II-II' of FIG. 1.

FIG. 4 is a sectional view of a semiconductor device according to still another example embodiment, taken along lines I-I' and II-II' of FIG. 1.

For concise description, in a description of the semiconductor device of FIG. 4, a previously described element may be identified by a similar or identical reference number without repeating an overlapping description thereof.

Referring to FIG. 4, the porous insulating layer 41 may be provided on the cell gate structures 100a and between the cell gate structures 100a. In this embodiment, the bottom surface of the portion of the porous insulating layer 41 delimiting the first air gap 115 may be substantially coplanar with a bottom surface of the hard mask patterns 35.

Figure 5:
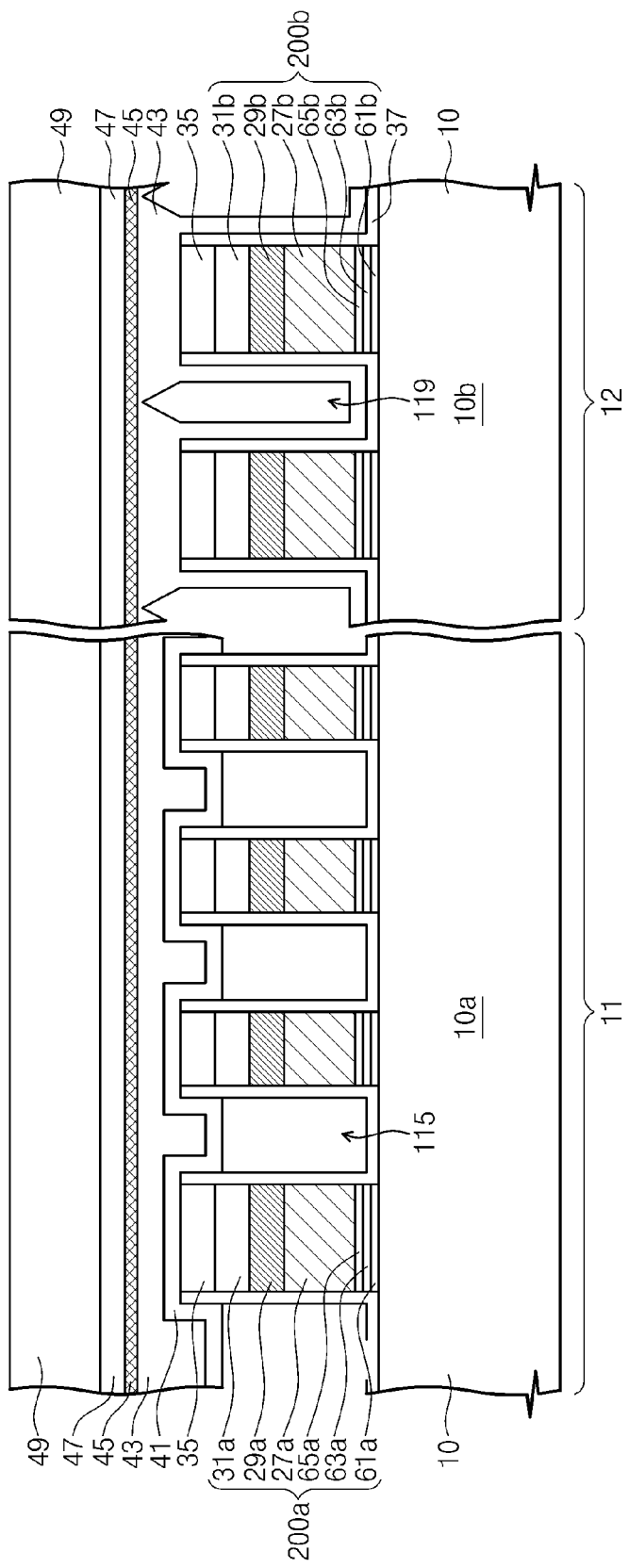
FIG. 5 is a sectional view of a semiconductor device according to another example embodiment, taken along lines I-I' and II-II' of FIG. 1.

FIG. 5 is a sectional view of a semiconductor device according to another example embodiment, taken along lines I-I' and II-II' of FIG. 1.

For concise description, in a description of the semiconductor device of FIG. 5, a previously described element may be identified by a similar or identical reference number without repeating an overlapping description thereof.

Cell and peripheral gate structures 200a and 200b may be provided on the substrate 10. The cell gate structures 200a may be provided on the cell region 11, while the peripheral gate structures 200b may be provided on the peripheral circuit region 12.

Each of the cell gate structures 200a may include a tunnel insulating pattern 61a, a charge storing pattern 63a, a blocking insulating pattern 65a, a control gate pattern 27a, a gate metal pattern 29a, and a capping pattern 31a that are sequentially stacked on the substrate 10.

Each of the peripheral gate structures 200b may include a lower oxide pattern 61b, a nitride pattern 63b, an upper oxide pattern 65b, an upper gate pattern 27b, a metal pattern 29b, and a protection pattern 31b that are sequentially stacked on the substrate 10.

The tunnel insulating pattern 61a and the lower oxide pattern 61b may include an oxide layer. The nitride pattern 63b may include a silicon nitride layer. The blocking insulating pattern 65a and the upper oxide pattern 63b may include a medium-temperature oxide layer or high-k dielectric layers.

The first air gaps 115 may be provided between the cell gate structures 200a. Each of the first air gaps 115 may be delimited by the sidewall of the etch stop layer 37 and the bottom surface of the porous insulating layer 41. In example embodiments, the bottom surface of the portion of the porous insulating layer 41 delimiting the first air gap 115 may be flat, and may be located at a level higher than that of the gate metal pattern 29a.

The second air gaps 119 may be provided between the peripheral gate structures 200b, and each of the second air gaps 119 may be delimited by the insulating layer 43. The second air gap 119 may extend upward in the insulating layer 43 such that a surface of the insulating layer 43 delimiting the second air gap 119 may be higher than an upper surface of the metal pattern 29b and may be V-shaped.

FIGS. 6A through 6H are sectional views illustrating a method of fabricating a semiconductor device, according to an example embodiment.

Figure 6A:
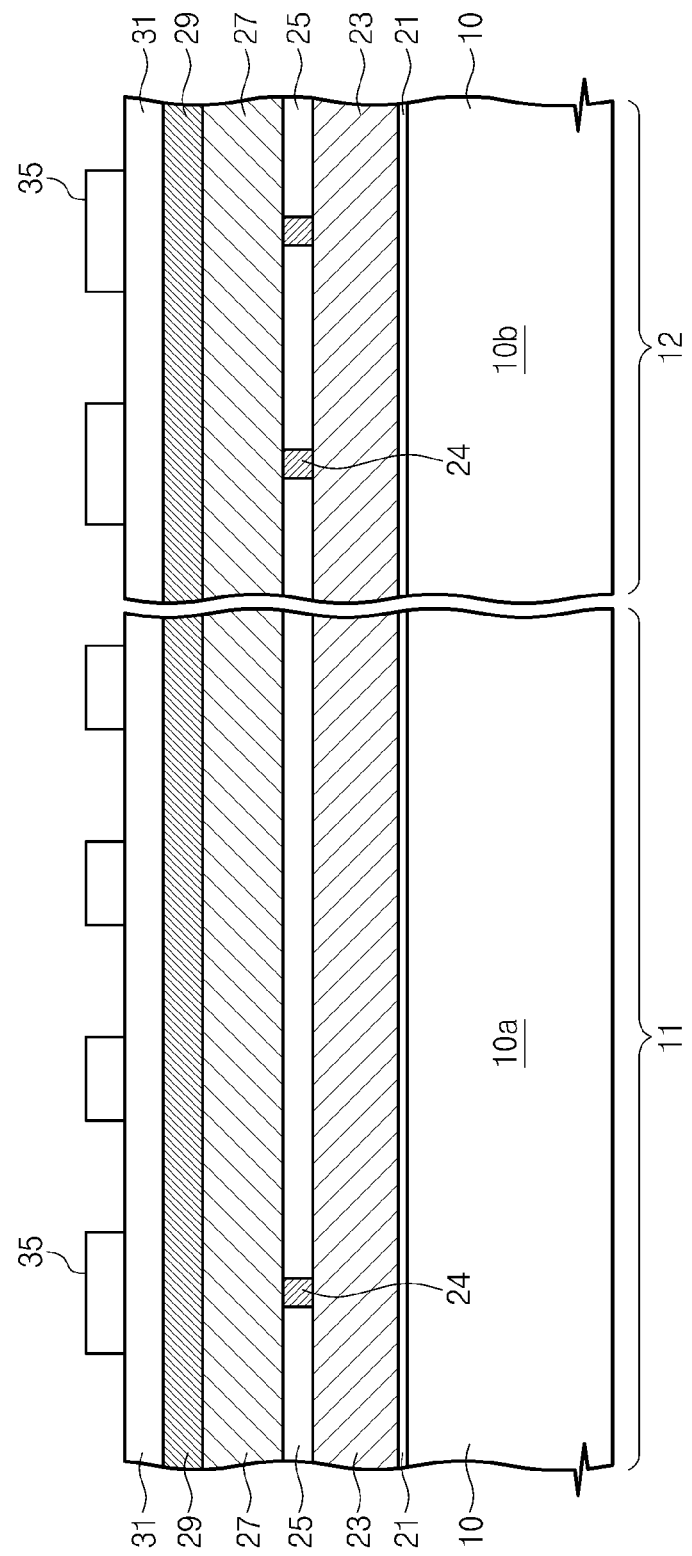

Referring to FIG. 6A, a substrate 10 may be provided. The substrate 10 may be, for example, a bulk silicon wafer, a silicon-on-insulator (SOI) wafer, a germanium wafer, a germanium-on-insulator wafer, a silicon-germanium substrate, or a substrate with an epitaxial layer obtained by a selective epitaxial growth (SEG) process. The substrate 10 may include a cell region 11 and a peripheral circuit region 12. The cell region 11 may include a first active region 10a. The peripheral circuit region 12 may include a second active region 10b. The first active region 10a and the second active region 10b may be portions of the substrate 10 delimited by a device isolation layer (not shown).

A gate insulating layer 21 may be formed on the substrate 10. The gate insulating layer 21 may be formed of a silicon oxide layer. For example, the formation of the gate insulating layer 21 may include a thermal oxidation process. In example embodiments, the gate insulating layer 21 may be formed thicker on the peripheral circuit region 12 than on the cell region 11. In other embodiments, the gate insulating layer 21 may be formed to have no difference in thickness between the cell region 11 and the peripheral circuit region 12.

A floating gate layer 23 may be formed on the gate insulating layer 21. The floating gate layer 23 may be formed using a chemical vapor deposition, a physical vapor deposition, or an atomic layer deposition. The floating gate layer 23 may be formed of a polysilicon layer. Further, the floating gate layer 23 may be doped with impurities, such as boron or phosphorus. The doping of the impurities into the floating gate layer 23 may be performed using an ion implantation process or an impurity diffusion process.

An inter-gate insulating layer 25 may be formed on the floating gate layer 23. The inter-gate insulating layer 25 may be formed using a chemical vapor deposition, a physical vapor deposition, or an atomic layer deposition. The inter-gate insulating layer 25 may be formed of an oxide layer having a thickness greater than that of the gate insulating layer 21 or an ONO layer including a lower oxide layer, a nitride layer, and an upper oxide layer sequentially stacked on the floating gate layer 23. Alternatively, the inter-gate insulating layer 25 may be formed of at least one of high-k dielectric layers, and, the high-k dielectric layers may be insulating metal oxide layers, such as a hafnium oxide layer or an aluminum oxide layer.

Contact electrodes 24 may be formed in the inter-gate insulating layer 25. The formation of the contact electrodes 24 may include patterning the inter-gate insulating layer 25 to form openings exposing the floating gate layer 23, and filling the openings with a metal layer. The contact electrodes 24 may be formed in such a way that each serves as a part of a ground selection gate electrode GSL or peripheral gate electrodes 100b to be formed in a subsequent process.

A control gate layer 27 may be formed on the inter-gate insulating layer 25. The control gate layer 27 may be formed using a chemical vapor deposition, a physical vapor deposition, or an atomic layer deposition. The control gate layer 27 may be formed of a polysilicon layer.

A gate metal layer 29 and a capping layer 31 may be sequentially formed on the control gate layer 27. The gate metal layer 29 and the capping layer 31 may be formed using a chemical vapor deposition, a plasma-enhanced chemical vapor deposition, a physical vapor deposition, or an atomic layer deposition. The gate metal layer 29 may have a single-layered or multi-layered structure including at least one layer selected from the group consisting of tungsten, molybdenum, tungsten nitride, molybdenum nitride, titanium nitride, or tantalum nitride. The capping layer 31 may include a silicon nitride layer.

Hard mask patterns 35 may be formed on the capping layer 31. The hard mask patterns 35 may be a silicon oxide layer.

Figure 6B:
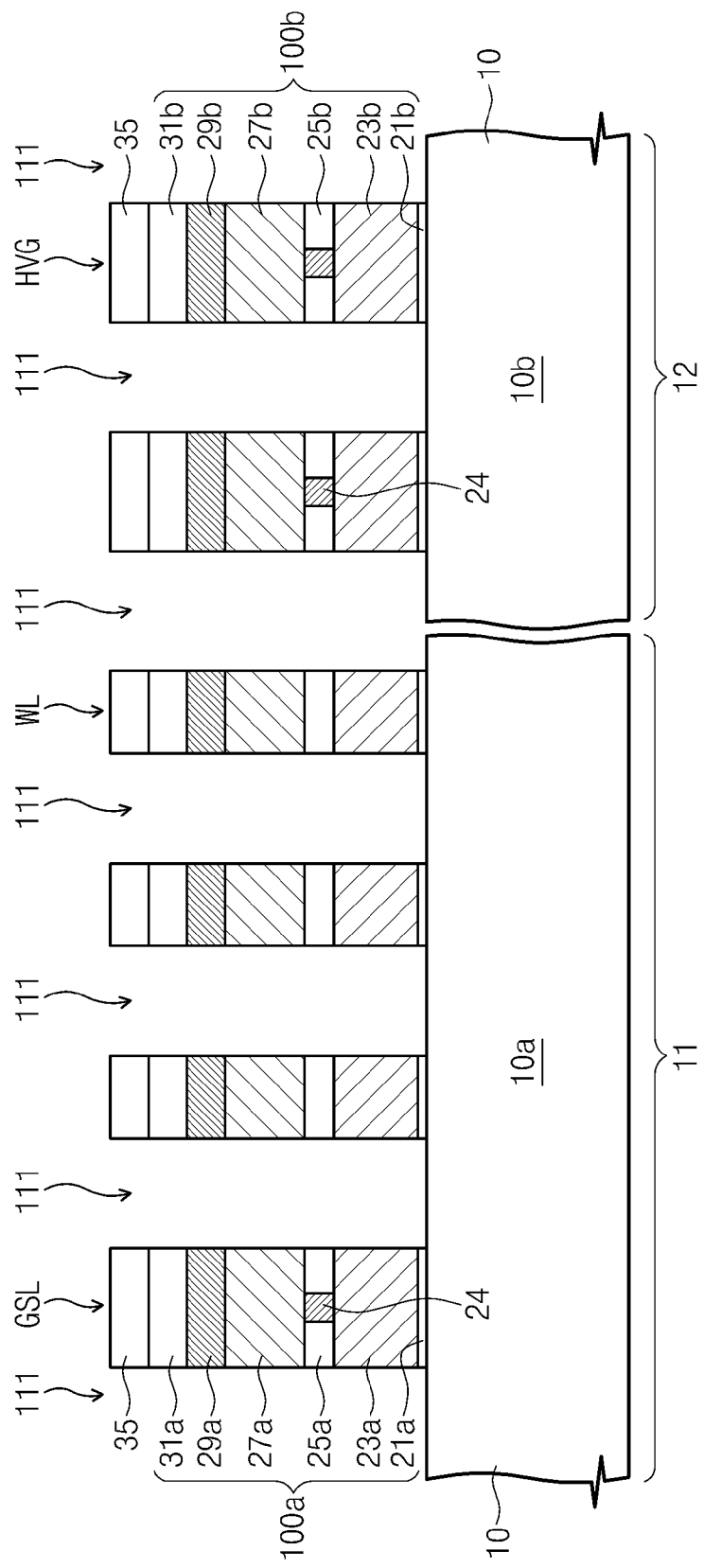

Referring to FIG. 6B, gate structures 100a and 100b may be formed by etching the layers provided on the substrate 10. For example, the formation of the gate structures 100a and 100b may include anisotropically etching the layers provided on the substrate 10 using the hard mask patterns 35 as an etch mask to form trenches 111. Each of the cell gate structures 100a may be delimited by an adjacent pair of the trenches 111. At least one ground selection gate electrode GSL, a plurality of cell gate electrodes WL, and at least one string selection electrode SSL (shown in FIG. 1) may be formed on the first active region 10a, and a plurality of peripheral gate structures 100b may be formed on the second active region 10b. The peripheral gate structures 100b may include a high-voltage gate electrode HVG. Each of the cell gate structures 100a may include a tunnel insulating pattern 21a, a floating gate pattern 23a, an inter-gate insulating pattern 25a, a control gate pattern 27a, a gate metal pattern 29a, and a capping pattern 31a that are sequentially stacked on the first active region 10a. At least one of the peripheral gate structures 100b may include a peripheral insulating pattern 21b, a lower gate pattern 23b, an intermediate insulating pattern 25b, an upper gate pattern 27b, a metal pattern 29b and a protection pattern 31b that are sequentially stacked on the second active region 10b.

Figure 6C:
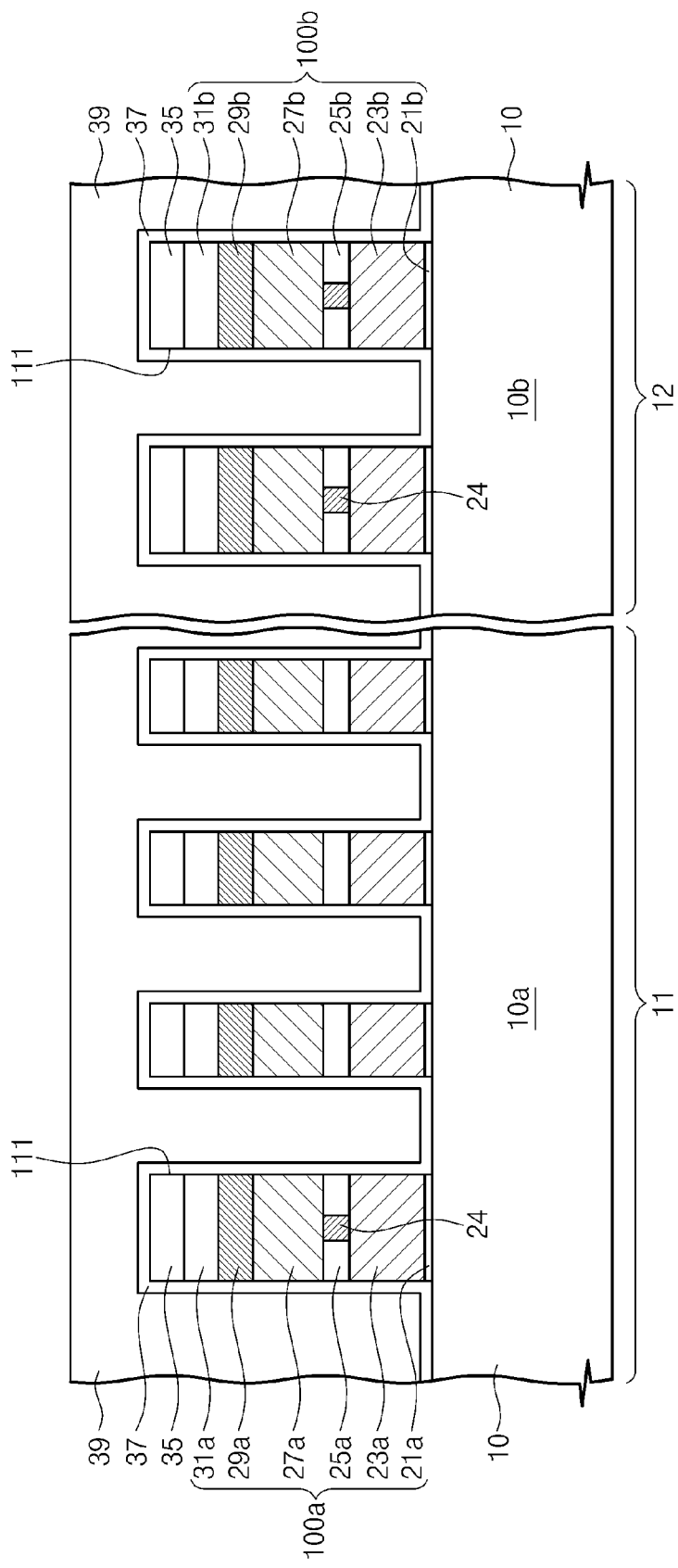

Referring to FIG. 6C, an etch stop layer 37 may be formed on the resulting structure with the gate structures 100a and 100b. In example embodiments, the etch stop layer 37 may be formed to cover conformally the resulting structure with the gate structures 100a and 100b. The etch stop layer 37 may be formed using an atomic layer deposition. The etch stop layer 37 may be formed of a silicon oxide layer or a silicon oxynitride layer.

A sacrificial layer 39 may be formed on the substrate 10 to cover the etch stop layer 37. The sacrificial layer 39 may be formed to fill the whole regions of the trenches 111. The sacrificial layer 39 may be a material having an etch selectivity with respect to the etch stop layer 37. For example, the sacrificial layer 39 may be a spin-on-hardmask (SOH) layer, an amorphous carbon layer (ACL), or a hydrocarbon-based insulating layer. Alternatively, the sacrificial layer 39 may be a photoresist layer or an amorphous silicon layer.

Figure 6D:
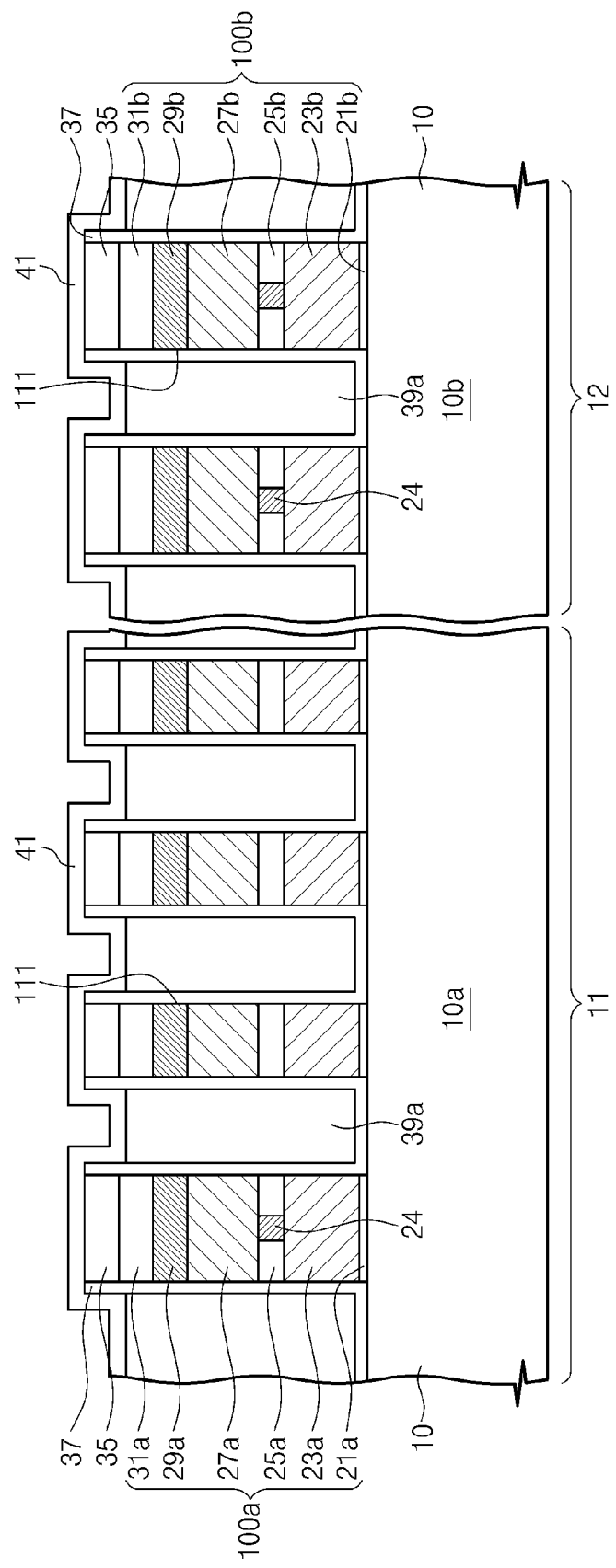

Referring to FIG. 6D, an etch-back process may be performed on the sacrificial layer 39. As the result of the etch-back process, a portion of the sacrificial layer 39 may be etched, thereby forming sacrificial patterns 39a localized in the trenches 111. In addition, the etch stop layer 37 may be removed from top surfaces of the capping pattern 31a and the protection pattern 31b, such that top surfaces of the capping pattern 31a and the protection pattern 31b may be exposed. In the trenches 111, the sacrificial pattern 39a may be formed to expose upper portions of the etch stop layer 37. In other embodiments, the sacrificial pattern 39a may be formed to fill completely the trenches 111. The sacrificial pattern 39a may be formed in such a way that its top surface is located at a level higher than that of the gate metal pattern 29a. In certain embodiments, the sacrificial pattern 39a may be formed to have a flat top surface.

A porous insulating layer 41 may be sequentially formed on the sacrificial pattern 39a. The porous insulating layer 41 may be conformally formed on the sacrificial pattern 39a, and further, may extend to cover top surfaces of the capping pattern 31a and the protection pattern 31b. In the case where the sacrificial pattern 39a has a flat top surface, the porous insulating layer 41 can be formed to have a flat bottom surface on the sacrificial pattern 39a.

The porous insulating layer 41 may be formed by forming a carbon-containing silicon oxide layer and performing a thermal treatment process to the resulting structure. As the result of the thermal treatment process, carbon atoms in the silicon oxide layer are bonded with silicon atoms to form a porous layer having a cage-like structure having a density lower than that of $SiO_2$, for example, a SiCOH layer. In example embodiments, trimethylsilane (3MS, $(CH_3)_3$—Si—H), tetramethylsilane (4MS, $(CH_3)_4$—Si), or vinyltrimethylsilane (VTMS, $CH_2$=CH—$Si(CH_3)_3$) may be used as a precursor for forming the SiCOH layer. Further, the formation of the SiCOH layer may include oxidizing the precursor with, for example, oxygen-containing gas or oxidant gas. The oxidant gas may be, for example, gaseous hydrogen peroxide. The porous insulating layer 41 may be an insulating layer, in which pores are provided to have a volumetric percentage of about 5-50%. In a wet etching process using HF etching solution, the porous insulating layer 41 may have an etch rate higher than that of the inter-gate insulating layer 25. For example, the porous insulating layer 41 may have an etch rate of about 100-200 Å/min when etched using 200:1 HF etching solution. The porous insulating layer 41 may be formed using an atomic layer deposition or a plasma-enhanced chemical vapor deposition.

Figure 6E:
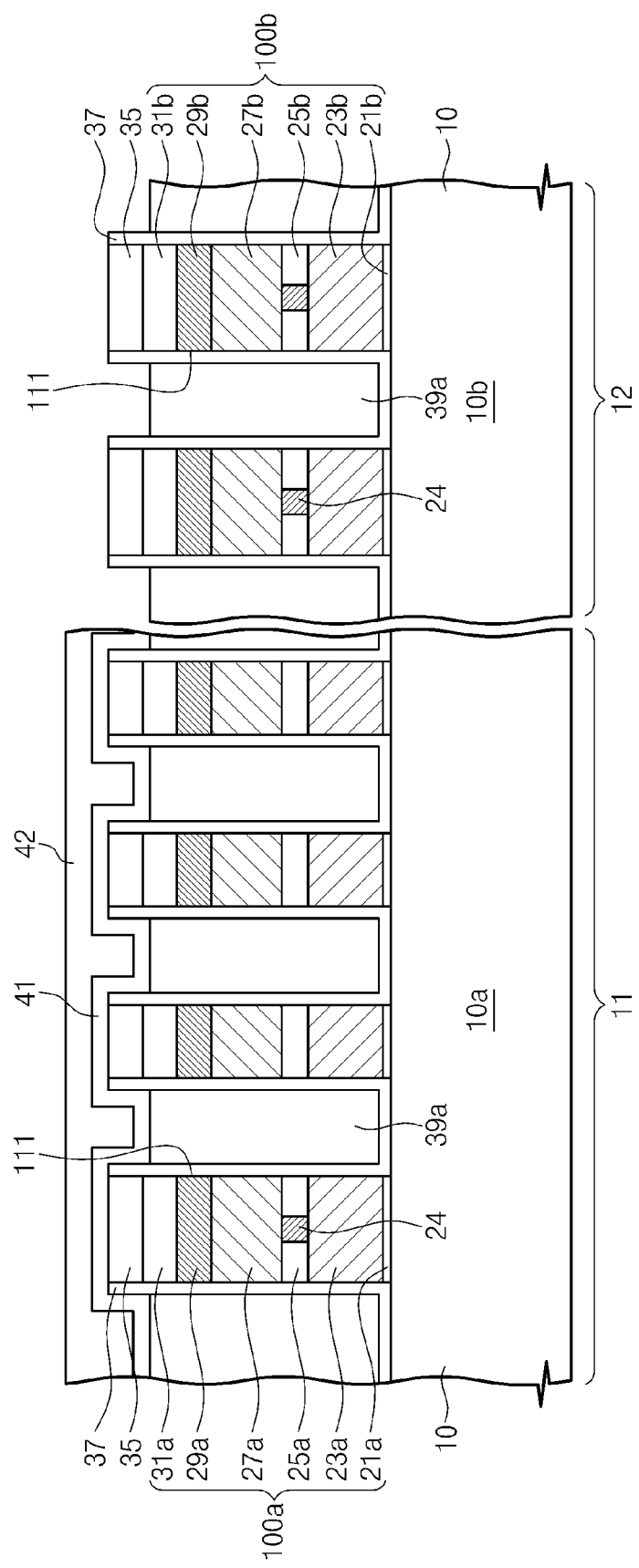

Referring to FIG. 6E, a photoresist layer 42 may be formed to cover the porous insulating layer 41 on the first active region 10a. The porous insulating layer 41 may be removed from the second active region 10b using the photoresist layer 42 as an etch mask.

As a result, top surfaces of the sacrificial pattern 39a and the protection pattern 31b may be exposed in the second active region 10b. The porous insulating layer 41 may be etched using a wet etching process or a dry etching process. By contrast, the porous insulating layer 41 may not be removed from the first active region 10a due to the presence of the photoresist layer 42. The photoresist layer 42 may be removed after the removal of the porous insulating layer 41 from the second active region 10b. For example, the photoresist layer 42 may be removed using an ashing process.

Figure 6F:
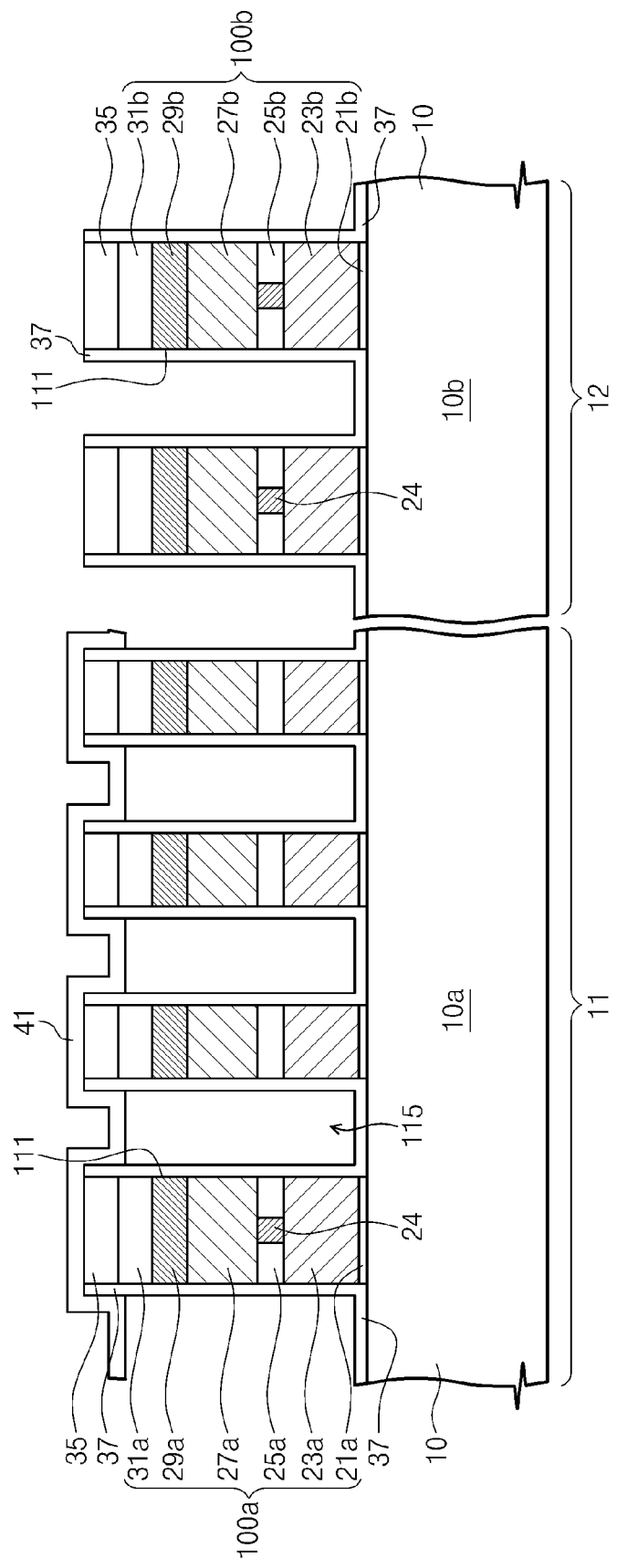

Referring to FIG. 6F, the sacrificial pattern 39a may be selectively removed through the pores of the porous insulating layer 41. As a result, a first air gap 115 may be formed below the porous insulating layer 41 in the first active region 10a. The first air gap 115 may be delimited by the etch stop layer 37 and the porous insulating layer 41 and filled with, for example, air. In the meantime, the sacrificial pattern 39a may be more easily removed from the second active region 10b, because of the absence of the porous insulating layer 41, such that the etch stop layer 37 can be completely exposed in the trenches 111 of the second active region 10b.

If the sacrificial pattern 39a is formed of an SOH layer or a photoresist layer, the removal of the sacrificial pattern 39a may be performed by an ashing process using oxygen, ozone, or UV, or a wet etching process. In the case where the sacrificial pattern 39a is formed of an amorphous silicon layer, the sacrificial pattern 39a may be isotropically removed using chlorine-containing gas.

Referring to FIG. 6G, an insulating layer 43 may be formed on the resulting structure provided with the first air gap 115. For example, the insulating layer 43 may be formed to cover the whole top surface of the porous insulating layer 41 on the first active region 10a. In other embodiments, on the second active region 10b, the insulating layer 43 may be formed on a top surface of the protection pattern 31b and extend to cover inner surfaces of the trenches 111 provided with the etch stop layer 37. The insulating layer 43 may be formed using, for example, a deposition process with undesirable step-coverage, and thus, the trenches 111 on the second active region 10b may not be filled with the insulating layer 43. For example, the insulating layer 43 may form an overhang at top entrances of the trenches 111, which means that a second air gap 119 may be formed in the trenches 111 of the second active region 10b. The insulating layer 43 may be formed of, for example a PE-TEOS layer. The insulating layer 43 may be formed using a PE-TEOS source gas mixed with one of oxygen or ozone. The second air gap 119 may be delimited by the insulating layer 43. The second air gap 119 may have an upper portion tapering upward.

Figure 6H:
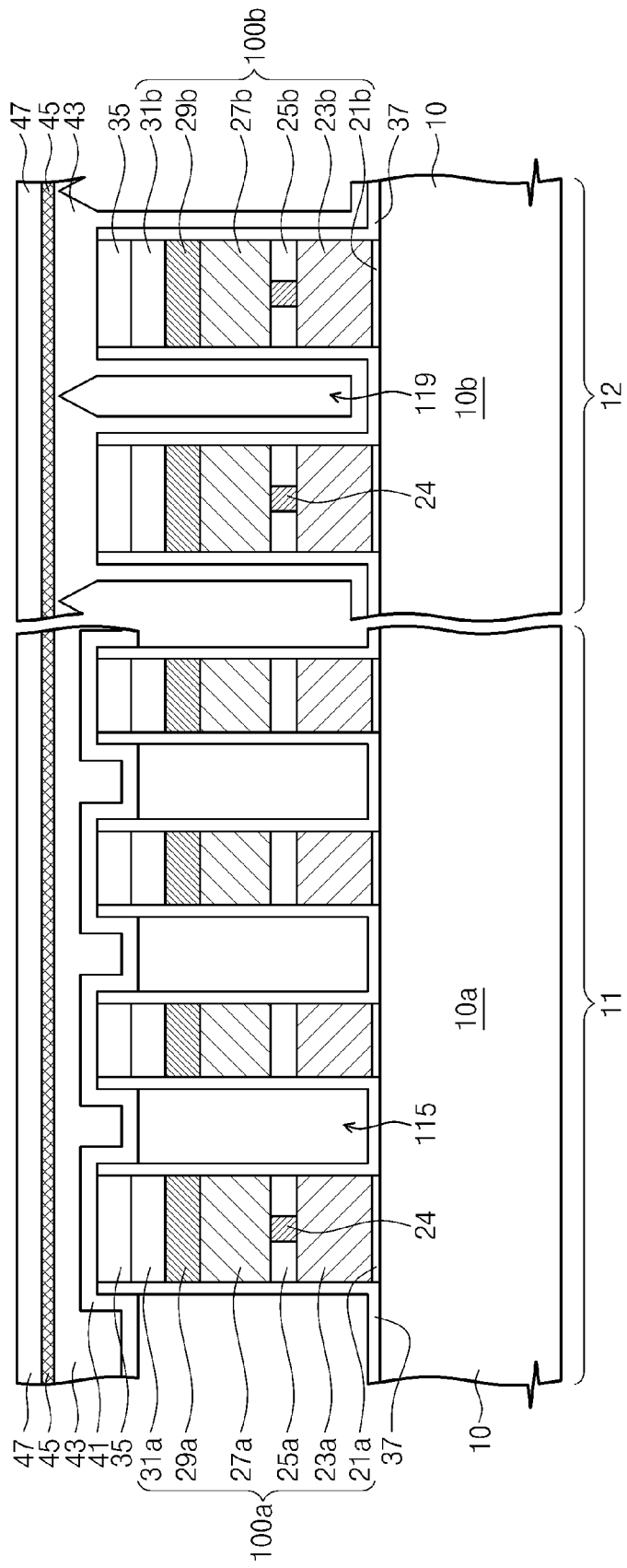

Referring to FIG. 6H, a metal protection layer 45 may be formed on the insulating layer 43 provided with the first air gap 115 and the second air gap 119. The metal protection layer 45 may be formed on the insulating layer 43 using an atomic layer deposition. The metal protection layer 45 may include a layer made of at least two elements selected from the group consisting of silicon (Si), oxygen (O), nitrogen (N), or hydrogen (H). For example, the metal protection layer 45 may be formed of a silicon nitride layer (SiN) or a silicon oxynitride layer (SiON). The metal protection layer 45 may be formed to have a thickness ranging from about 10 Å to 100 Å.

In other embodiments, as shown in FIG. 3, the metal protection layer 45 may be formed before the formation of the insulating layer 43. Accordingly, on the first active region 10a, the metal protection layer 45 may be formed to cover conformally the porous insulating layer 41. On the second active region 10b, the metal protection layer 45 may be formed to cover conformally the etch stop layer 37 and the hard mask pattern 35.

A lower interlayered insulating layer 47 may be formed on the metal protection layer 45. The lower interlayered insulating layer 47 may include a silicon oxide layer.

Figure 7:
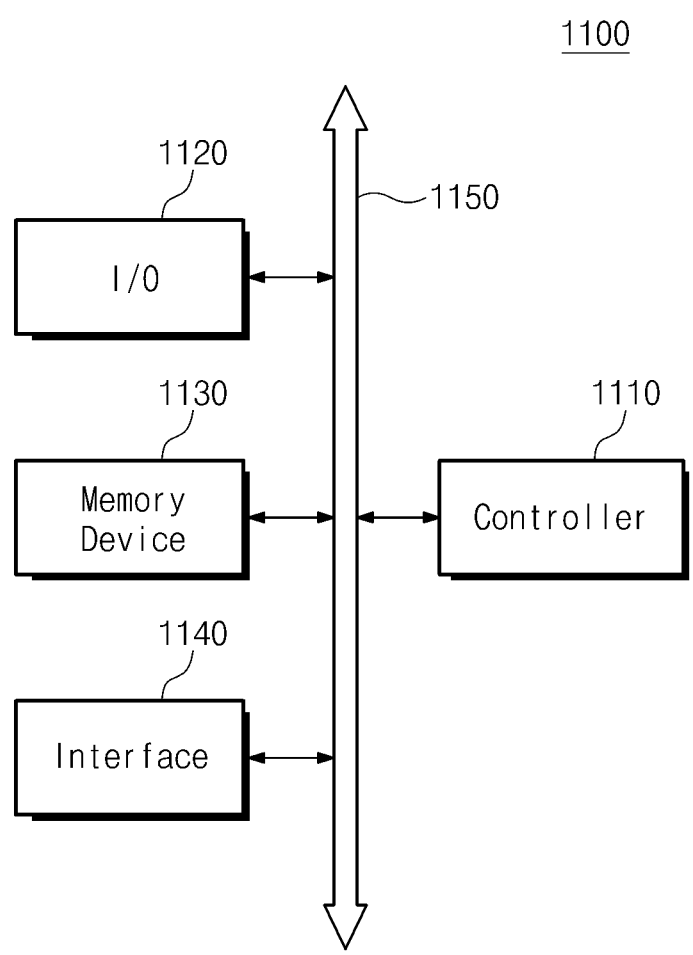
FIG. 7 is a schematic block diagram illustrating an example of electronic systems including a semiconductor device according to various example embodiments.

FIG. 7 is a schematic block diagram illustrating an example of electronic systems including a semiconductor device according to various example embodiments.

Referring to FIG. 7, an electronic system 1100 according to various example embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the input-output unit 1120, the memory device 1130, and/or the interface 1140 may be configured to include one of the semiconductor devices according to various example embodiments.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 8:
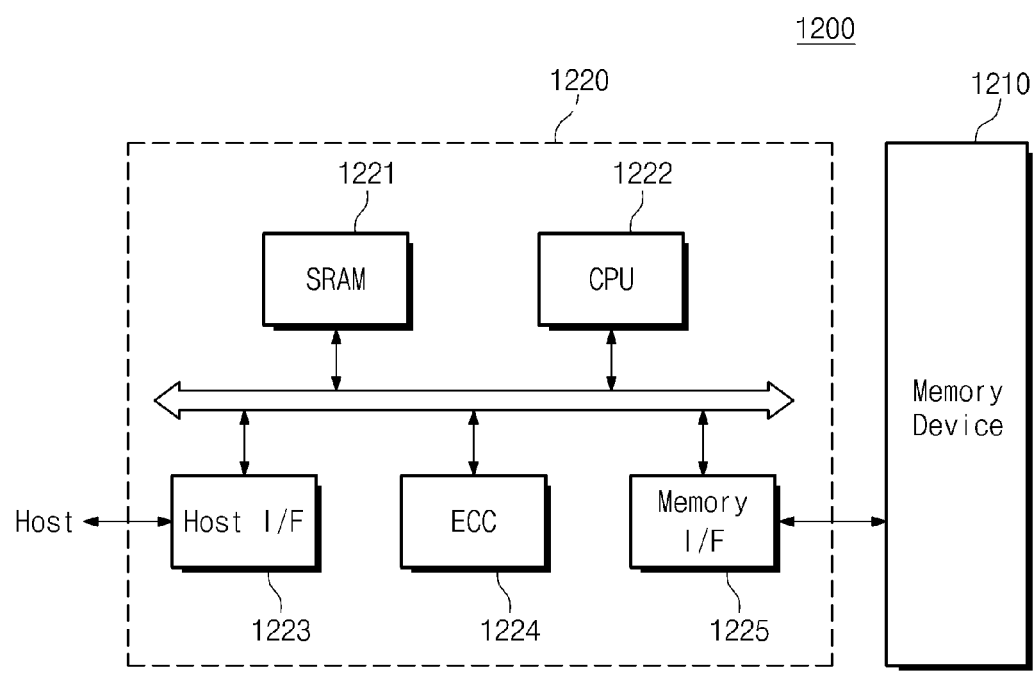
FIG. 8 is a schematic block diagram illustrating an example of memory cards including the semiconductor memory devices according to various example embodiments.

FIG. 8 is a schematic block diagram illustrating an example of memory cards including the semiconductor memory devices according to various example embodiments.

Referring to FIG. 8, a memory card 1200 according to various example embodiments may include a memory device 1210. The memory device 1210 may include at least one of the semiconductor memory devices according to various example embodiments. In other embodiments, the memory device 1210 may further include a semiconductor memory device, which is of a different type from the semiconductor memory devices according to various example embodiments. For example, the memory device 1210 may further include a nonvolatile memory device and/or a static random access memory (SRAM) device. The memory card 1200 may include a memory controller 1220 that controls data communication between a host and the memory device 1210. The memory device 1210 and/or the memory controller 1220 may be configured to include at least one of the semiconductor devices according to various example embodiments.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may be provided in the form of solid state disks (SSD), instead of hard disks of computer systems.

Figure 9:
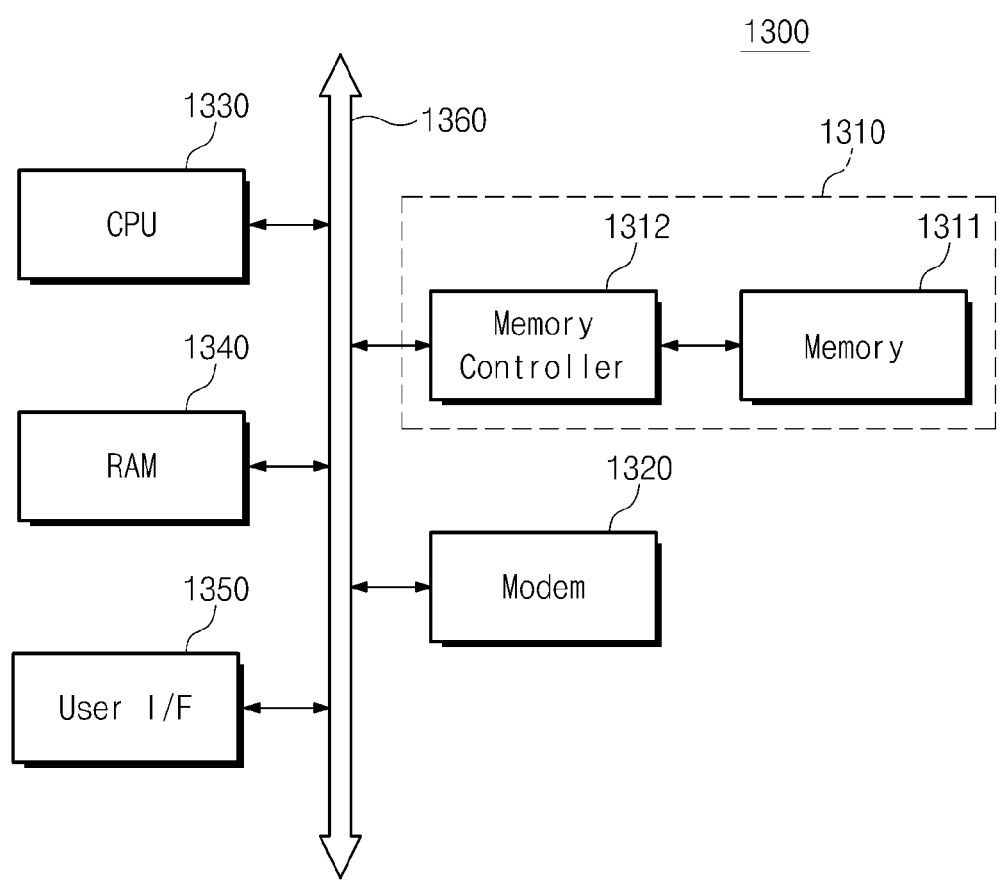
FIG. 9 is a schematic block diagram illustrating an example of information processing systems including a semiconductor device according to various example embodiments.

FIG. 9 is a schematic block diagram illustrating an example of information processing systems including a semiconductor device according to various example embodiments.

Referring to FIG. 9, an information processing system 1300 includes a memory system 1310, which may include at least one of the semiconductor devices according to various example embodiments. The information processing system 1300 also includes a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

According to example embodiments, a semiconductor device may be configured to have first air gaps having a uniform size between the cell gate structures, and thus, cell-to-cell interference can be improved. Further, the bottom surface of the portion of the porous insulating layer delimiting the first air gap may be formed to be higher than that an upper surface of a metal gate pattern and a metal protection layer may be formed on the first air gap. Accordingly, preventing or inhibiting the metal gate pattern from being damaged when a subsequent thermal oxidation process is performed may be possible.

While some example embodiments have been particularly shown and described, it will be understood by one of ordinary skill in the art that variations in form and detail may be made therein without departing from the spirit and scope of the attached claims.

What is claimed is:

1. A semiconductor device, comprising:
  cell gate structures on a substrate, the cell gate structures having first air gaps therebetween;
  peripheral gate structures on the substrate, the peripheral structures having second air gaps therebetween;
  an insulating layer on the cell gate structures and the peripheral gate structures, the insulating layer configured to cover sidewalls of the peripheral gate structures and the second air gaps; and
  a porous insulating layer between the cell gate structures and the insulating layer, the porous insulating layer configured to cross the cell gate structures to delimit the first air gaps,
  wherein a bottom surface of a portion of the porous insulating layer delimiting the first air gaps is located below a portion of the insulating layer covering an upper portion of the second air gaps.

2. The device of claim 1, further comprising:
  a metal protection layer on the insulating layer.

3. The device of claim 1, further comprising:
  a metal protection layer between the insulating layer and the porous insulating layer, wherein the metal protection layer extends between the peripheral gate structures and the insulating layer.

4. The device of claim 3, wherein the metal protection layer comprises one of silicon (Si), oxygen (O), nitrogen (N), hydrogen (H) and a combination thereof.

5. The device of claim 1, wherein
each of the cell gate structures comprises a gate metal pattern,
the porous insulating layer covers a top surface of the cell gate structures, and
the bottom surface of the portion of the porous insulating layer delimiting the first air gaps is located above a top surface of the gate metal pattern.

6. The device of claim 1, wherein the bottom surface of the portion of the porous insulating layer delimiting the first air gaps is flat, and the portion of the insulating layer covering an upper portion of the second air gaps is V-shaped.

7. The device of claim 1, wherein each of the first air gaps is delimited by the cell gate structures and the porous insulating layer, and each of the second air gaps is delimited by the insulating layer.

* * * * *